United States Patent [19]
Johnson

[11] 4,413,227
[45] Nov. 1, 1983

[54] NEGATIVE RESISTANCE ELEMENT

[75] Inventor: Kenneth C. Johnson, Cheadle, England

[73] Assignee: International Computers Limited, Stevenage, England

[21] Appl. No.: 323,801

[22] Filed: Nov. 23, 1981

[30] Foreign Application Priority Data

Nov. 27, 1980 [GB] United Kingdom ............. 8038142

[51] Int. Cl.³ .............................................. G05F 3/08
[52] U.S. Cl. .................................. 323/315; 307/322; 338/20
[58] Field of Search ............... 323/311, 312, 315–317, 323/352, 364, 383; 338/20; 307/322

[56] References Cited

U.S. PATENT DOCUMENTS 3,223,849  12/1965  Todd ................................. 307/322
3,670,183   6/1972  Ager ................................. 338/20
4,015,146   3/1977  Aihara et al. ..................... 307/322

OTHER PUBLICATIONS

IBM Technical Disclosure Bulletin, vol. 14, No. 12, p. 3803, May 1972.

Primary Examiner—William H. Beha, Jr.
Attorney, Agent, or Firm—Lee, Smith & Jager

[57] ABSTRACT

A voltage controlled negative resistance with two terminals (12,13; 15,16; 19,20) and first and second current paths connected between the terminals. A current mirror arrangement (T2, T3; T5, T6, T7, T8; T9, T10) so controls the current in the second path in accordance with the value of the current in the first path such that any variations of current in the second path are larger than in the opposite sense to variations of current in the first path.

3 Claims, 6 Drawing Figures

NEGATIVE RESISTANCE ELEMENT

BACKGROUND TO THE INVENTION

This invention relates to negative resistance elements. Such elements can be considered as being of two types: voltage-controlled and current-controlled. A voltage-controlled negative resistance element is defined herein as an electical device having the property that an increase in the voltage applied across it will result in a decrease in the current flowing through it in the direction of the applied voltage (or an increase in the current flowing through it in the direction opposite to that of the applied voltage). Similarly, a current-controlled negative resistance element is defined herein as an electrical device having the property that an increase in the current flowing through it will result in a decrease in the voltage drop across it in the direction of the current flow.

The object of the present invention is to provide a novel form of voltage-controlled negative resistance element. The invention makes use of a circuit arrangement known as a current mirror. A current mirror basically comprises two matched transistors with their bases and emitters interconnected so that the current through one of the transistors is accurately reproduced in the other. Such an arrangement is described for example in British Pat. No. 1410021.

SUMMARIES OF THE INVENTION

According to a first aspect of the invention there is provided a voltage-controlled negative resistance element having first and second terminals; a first current path between the terminals such that on application of a voltage drop between the terminals, current is caused to flow through the first path in the direction of the applied voltage drop; a second current path between the first and second terminals; a current mirror arrangement adapted to control the magnitude and sense of current in the second path in accordance with the magnitude and sense of current in the first path, in such manner that variations on the current in the second path are larger than and in the opposite sense to variations of the current in the first path whereby the resultant variation of current flow between the two terminals is in the opposite sense to the variation of the voltage drop between the terminals.

According to a further aspect of the invention, there is provided a voltage controlled negative resistance element having first and second terminals, and first and second current paths between the terminals, wherein when a voltage drop as applied between the terminals a current is caused to flow through the first path in the direction of the applied voltage drop, there being a current mirror arrangement for controlling current flow in the second path, the mirror arrangement comprising active components which so control current flow in the second path in dependence upon the value of the current in the first path that current variations in the second path are greater than and in the opposite sense to those of the first path.

BRIEF DESCRIPTION OF THE DRAWINGS

Various embodiments of the invention will now be described by way of example with reference to the accompanying drawings of which

DESCRIPTION OF THE EMBODIMENTS OF THE INVENTION

FIG. 1

Figure 1:
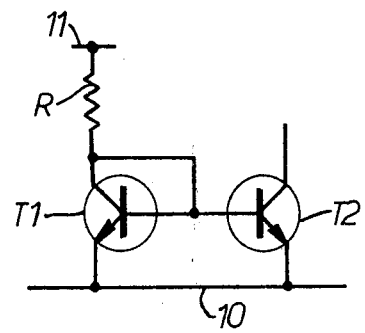
FIG. 1 illustrates the basic principle of a current mirror.

FIG. 1 shows the basic principle of the current mirror. The circuit comprises two NPN transistors T1 and T2, whose bases are coupled together and whose emitters are both connected to a negative voltage line 10. The collector of transistor T1 is connected through a resistor R to a positive voltage line 11, and is also connected directly to its own base. Both transistors are so biased that they operate in the constant-current region of their characteristic curves.

It can be shown that the current flowing through transistor T1 is controlled by the value of the resistor R, whereas the current through transistor T2 is controlled by the current flowing through T1. If the two transistors are formed with characteristics which are equal to a high degree of accuracy (which is possible if both transistors are part of the same integrated circuit chip), then the current flowing through T2 will be accurately equal to that through T1. Alternatively, if the two transistors have the same characteristics except that the base area of T2 is a multiple m of that of T1, then the current through T2 will be m times that through T1.

It will be appreciated that a current mirror can equally well be constructed using PNP transistors.

FIG. 2

Figure 2:
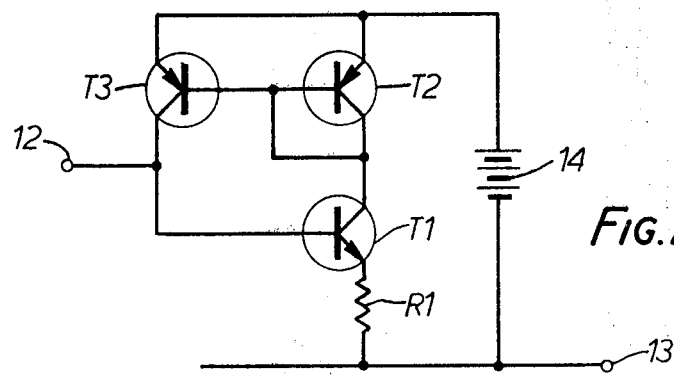
FIGS. 2-5 respectively show four different forms of negative resistance element in accordance with the invention.

The negative resistance element shown in FIG. 2 comprises an NPN transistor T1 and two PNP transistors T2 and T3. A first terminal 12 is connected to the base of T1 and also to the collector of T3. A second terminal 13 is connected to the emitter of T1 by way of a resistor R1 and also to the negative end of a voltage supply 14. The positive end of the supply 14 is connected to the emitters of the transistors T2 and T3. The collectors of T1 and T2 are connected together. Transistors T2 and T3 are interconnected to form a current mirror similar to that in FIG. 1, the base area of T3 being four times that of T2 so that the current through T3 is four times that through T2.

In operation, if a voltage difference V is applied between the terminals 12, 13 the current through T1 increases by V/R where R is the value of the resistor R1. This causes an equal change in the current through T2 which in turn causes an increase in the current through T3 of 4V/R. This change in current through T3 is in the opposite direction to the applied input voltage. Hence, it can be seen that the circuit acts as a negative resistance of value −R/4 ohms. Typically, R=300 ohms.

In a modification of the circuit in FIG. 2, a further PNP transistor (not shown) may be connected as an emitter-follower stage between the input terminal 12 and the base of T1.

FIG. 3

Figure 3:
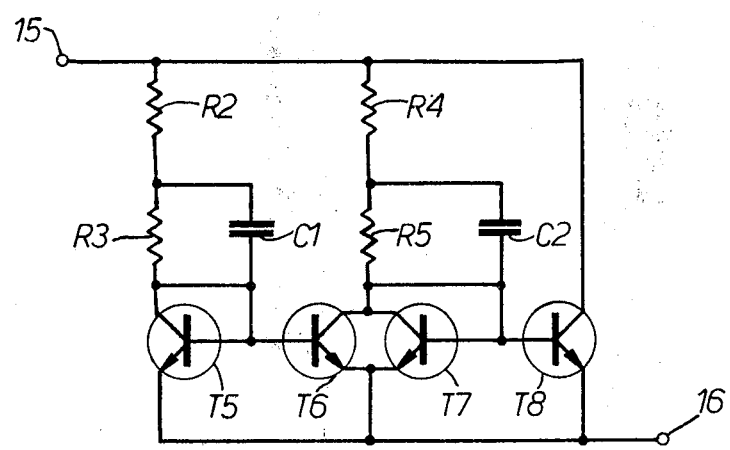

The negative resistance element shown in FIG. 3 comprises four NPN transistors T5–T8. Transistors T5 and T6 have the same base areas, whereas the base area of transistor T8 is twelve times that of T7. A first terminal 15 is connected by way of resistors R2, R3 to the collector of T5, by way of resistors R4, R5 to the collectors of T6 and T7, and also directly to the collector of T8. A second terminal 16 is connected to the emitters of all four transistors.

The values of the resistors R2–R5 in this particular example are as follows:
R2—750 ohms
R3—1.75 K ohms
R4—750 ohms
R5—500 ohms.

Transistors T5 and T6 form a current mirror, such that the current flowing through T6 is equal to that through T5. Similarly, transistors T7 and T8 form a current mirror such that the current through T8 is twelve times that through T7.

Transistors T6 and T7 share the current flowing through resistors R4 and R5. Therefore, any increase in the current drawn by T6 will result in a corresponding decrease in the current flowing through T7, and vice versa.

It is assumed that, in operation, the terminal 15 is connected to a suitable power supply (not shown) which holds it at a mean voltage of +5.7 volts with respect to the terminal 16, and that input signals are applied to the circuit in the form of high-frequency variations with respect to this mean voltage.

When no input signal is present, a steady current of 2 mA flows through R2, R3 and T5 (the voltage drop across the base-emitter junction of T5 being 0.7 volts). An equal current of 2 mA therefore flows through T6. Also, in this no-input condition, a steady current of 4 mA flows through resistors R4 and R5. Since this current is shared between T6 and T7, the current through T6 must also be 2 mA. Hence, the current through T8 is $12 \times 2$ mA $\times 24$ mA.

Resistor R3 is shunted by a capacitor C1, and resistor R5 and transistors T6, T7 are shunted by a capacitor C2. Both these capacitors are of sufficiently large value to present negligible impedance to the high-frequency input signals. Therefore, as far as the input signals are concerned, both R3 and R5 are effectively shorted-out, and input signals do not have any appreciable effect on the size of the current drawn by the combination of T6 and T7.

Thus, when an input signal is applied to the circuit, causing the voltage of the terminal 15 to rise by V volts, the current flowing through T5 increases by V/R amps where R is the value of resistor R2. This causes an equal increase in the current through T6, and hence the current through T7 decreases by the same amount. Hence, the current flowing through T8 decreases by 12 V/R amps.

It can be seen that T8 effectively acts as a negative resistance of value $-R/12$ ohms i.e. $-62.5$ ohms in this particular example. The whole circuit is therefore equivalent to the parallel combination of two 750 ohms resistors (R2 and R4) and a $-62.5$ ohm resistor (T8). This combination has a net resistance of $-75$ ohms.

The arrangement described above has a current consumption of 30 mA at a mean voltage of 5.7 volts, and operates linearly for voltage swings up to ±1.5 volts from the mean value.

FIG. 4

Figure 4:
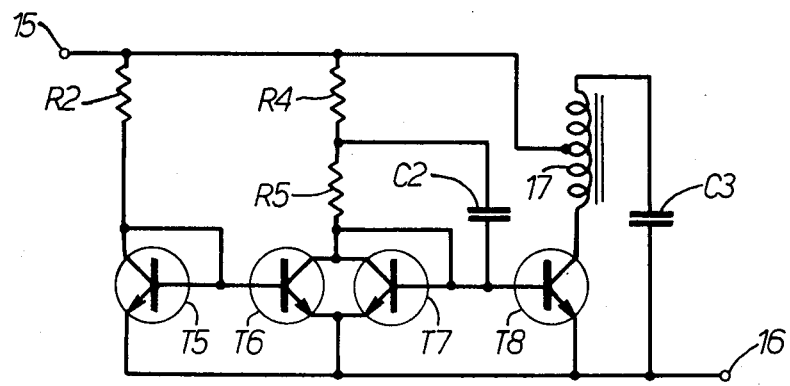

The circuit shown in FIG. 4 is a modification of that in FIG. 3, and corresponding components have been identified by the same reference numerals in the two figures. The main difference in FIG. 4 is that an autotransformer 17 is introduced, one end being connected to the collector of T8. The opposite end of the transformer is connected via capacitor C3 to terminal 16, while the centre tapping point is connected to terminal 15. Also, in this circuit, R3 and C1 are omitted, and the remaining resistors R2, R4 and R5 are given the following values:
R2—1.5 k ohms
R4—500 ohms
R5—437.5 ohms In this circuit, as in the case of FIG. 3, when an input signal is applied to the circuit, causing an increase in voltage of V volts between terminals 15 and 16, the current through T8 decreases by 12 V/R amps. As a result, the current flowing from terminal 15 through the transformer 17 decreases by 24 V/R amps. Hence, it can be seen that the combination of the transformer 17 and the transistor T8 effectively acts as a negative resistance of value $-R/24$ ohms (i.e. 62.5 ohms in this particular example).

The whole circuit is therefore equivalent to the parallel combination of this $-62.5$ ohm resistance with a 1.5 K ohm resistor (R2) and a 500 ohm resistor (R4). This combination has a net resistance of $-75$ ohms.

It can be seen, therefore, that the circuit of FIG. 4 has the same negative resistance value as that of FIG. 3. The advantage of FIG. 4, however, is that because of the introduction of the transformer, the circuit can handle voltage swings of up to ±3 volts, compared with ±1.5 volts in the case of FIG. 3.

FIG. 5

Figure 5:
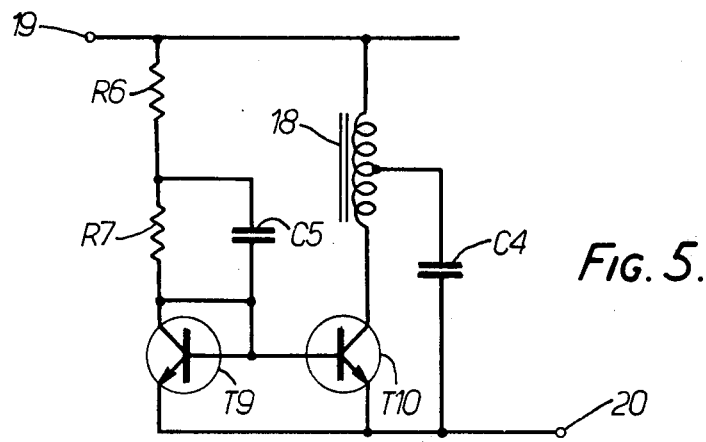
Figure 6:
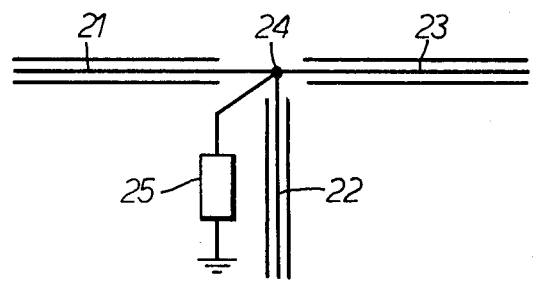
FIG. 6 shows the way in which a negative resistance element can be used to match a T-junction in a co-axial cable.

The negative resistance element shown in FIG. 5 comprises two NPN transistors T9 and T10, and an autotransformer 18 with a 2:1 turns ratio. A first terminal 19 is connected via resistors R6 and R7 to the collector of T9, and is also connected by way of the transformer 18 to the collector of T10. A second terminal 20 is connected to the emitters of both transistors and is also connected, by way of a capacitor C4, to the tapping point of the transformer. Resistor R7 is effectively shorted-out at high frequencies by a capacitor C5. Transistors T9 and T10 form a current mirror, the area of T10 being eight times that of T9.

In this particular example, the resistors have the following values:
R6—1125 ohms
R7—541.7 ohms.

As in the case of FIGS. 3 and 4 it is assumed that, in operation, the terminal 19 is held at a mean voltage of 5.7 volts with respect to the terminal 20, and that input signals are applied as high-frequency variations of voltage with respect to this mean.

In the no-input condition, transistor T9 draws a steady current of 3 mA, and hence transistor T10 draws a steady current of 24 mA. If a signal is applied to the circuit, causing the voltage at terminal 19 to rise by V volts, the current through T9 rises by V/R amps, where R is the value of resistor R6. The current through T10 will therefore rise by 8V/R amps, and hence the current drawn by the transformer 18 from terminal 19 will drop by 16V/R amps. Hence, it can be seen that the combination of the transformer 18 and the transistor T10 effectively acts as a negative resistance of value −R/16 ohms.

The whole circuit is therefore equivalent to the parallel combination of this negative resistance with the register R6. This combination has a net resistance of −R/15 ohms (i.e. −75 ohms with the particular values given above).

The circuit of FIG. 5 therefore has the same negative resistance value as in the case of FIGS. 3 and 4. As in FIG. 4, however, the circuit of FIG. 5 is capable of handling voltage swings of ±3 volts, because of the action of the transformer. In the case of FIG. 5, the reversal of the direction of current flow necessary for achieving negative resistance is obtained by connecting the transformer 18 so as to give an inversion, whereas in FIGS. 3 and 4, the reversal was obtained by means of the current-sharing arrangement of transistors T6 and T7.

FIG. 6

This shows a possible use for a negative resistance element in accordance with the invention. The figure shows three co-axial cables 21,22 and 23, each of 75 ohms characteristic impedance. The cables are connected together at a point 24 to form a T-junction. A −75 ohm negative resistance element 25 in accordance with the invention is connected between the point 24 and earth.

As result, the impedance of the junction as seen from any of the three branches is equal to the parallel combination of two 75 ohm resistances and one −75 ohm resistance, giving a net resistance of 75 ohm. The junction is therefore fully matched.

I claim:

1. A voltage controlled negative resistance element comprising:
    first and second terminals;
    a first current path between the terminals such that on application of a voltage drop between the terminals a current is caused to flow through the first path in the direction of the applied voltage drop;
    a second current path between the first and second terminals,
    a first current mirror arrangement connected between said first and second current paths for controlling the magnitude and sense of the current in dependence of the value of the current in the first path such that variations in the second path are greater than and in the opposite sense to those of the first path, said first current mirror arrangement including a transistor connected in each said current path, with the effective base areas of the two transistors inter-connected, said transistors having similar characteristics except that the effective base area of one of the transistors exceeds that of the other transistor.

2. A voltage-controlled negative resistance element as claimed in claim 1, and including a third current path between the first and second terminals, and a second current mirror arrangement including transistors connected between the second and third current paths, the second current mirror arrangement including transistors in the second and third current paths which are such that the operational characteristics of the transistors of the first and second current mirror arrangements provided in the second current path are such as to enable equal division of current flow into such transistors.

3. A voltage-controlled negative resistance element as claimed in claim 2, in which the first current mirror arrangement is arranged to maintain the current in the first and second current paths equal one to the other, and in which the second current mirror arrangement is arranged to produce the required magnitude for the current of the reverse sense to that in the first current path.

* * * * *